(12) United States Patent
Choi et al.

(10) Patent No.: US 6,998,840 B2
(45) Date of Patent: Feb. 14, 2006

(54) FLUXGATE SENSOR INTEGRATED HAVING STACKED MAGNETIC CORES IN PRINTED CIRCUIT BOARD AND METHOD FOR MANUFACTURING THE SAME

(75) Inventors: Won-youl Choi, Suwon (KR); Keon-yang Park, Chungchongnam-do (KR); Byeong-cheon Koh, Sungnam (KR); Myung-sam Kang, Chungchongnam-do (KR); Kyung-won Na, Yongin (KR); Sang-on Choi, Suwon (KR)

(73) Assignee: Samsung Electro - Mechanics Co., Ltd., Kyungki-do (KR)

( * ) Notice: Subject to any disclaimer, the term of this patent is extended or adjusted under 35 U.S.C. 154(b) by 80 days.

(21) Appl. No.: 10/228,948

(22) Filed: Aug. 28, 2002

(65) Prior Publication Data

US 2003/0173961 A1    Sep. 18, 2003

(30) Foreign Application Priority Data

Mar. 14, 2002    (KR) ............................... 2002-13753

(51) Int. Cl.
*G01R 33/04*    (2006.01)
(52) U.S. Cl. ...................................... 324/253; 324/260
(58) Field of Classification Search ................ 324/249, 324/200, 253–255, 260, 244; 336/200, 199, 336/212, 221, 226
See application file for complete search history.

(56) References Cited

U.S. PATENT DOCUMENTS 5,450,263 A * 9/1995 Desaigoudar et al. ....... 360/110

FOREIGN PATENT DOCUMENTS

| GB | 2339294 | * | 1/2000 |
| JP | 8-179023 | * | 7/1996 |

* cited by examiner

*Primary Examiner*—Jay Patidar
(74) *Attorney, Agent, or Firm*—Sughrue Mion, PLLC

(57) ABSTRACT

A fluxgate sensor integrated in a printed circuit board. The fluxgate sensor has soft magnetic cores having a lower core and an upper core mounted on the lower core, for forming a closed magnetic path on a printed circuit board, an excitation coil formed as a metal film, alternately winding the upper and the lower soft magnetic cores substantially in a number '8' pattern, and a pick-up coil formed as a metal film, having a structure of winding the upper and the lower soft magnetic cores substantially in a solenoid pattern, the pick-up coil being placed on the same plane as an external contour of the excitation coil.

2 Claims, 8 Drawing Sheets

FLUXGATE SENSOR INTEGRATED HAVING STACKED MAGNETIC CORES IN PRINTED CIRCUIT BOARD AND METHOD FOR MANUFACTURING THE SAME

BACKGROUND OF THE INVENTION

1. Field of the Invention

The present invention generally relates to a fluxgate sensor, and more particularly, to a fluxgate sensor integrated in a printed circuit board and a manufacturing method thereof. The present application is based on Korean Patent Application No. 2002-13753, filed Mar. 14, 2002, which is incorporated herein by reference.

2. Description of the Prior Art

Existence of magnetic energy has been proven through various physical phenomena, and a fluxgate sensor enables a human to indirectly perceive magnetic energy, as it is unperceivable to human sense organs such as eyes and ears. As for the fluxgate sensor, a magnetic sensor employing a soft magnetic coil has been used for a long time. The magnetic sensor is made by winding a coil around a relatively large bar-shaped core or an annular core formed of a soft magnetic ribbon. Also, an electronic circuit is employed to obtain a magnetic field in proportion to the measured magnetic field.

The conventional fluxgate sensor, however, has the following problems. That is, due to the structure of the conventional fluxgate sensor in which the coil is wound around the large bar-shaped core or the annular core made of the soft magnetic ribbon, production costs are high, and the volume of the overall system is large. Also, flux leakage is inevitable in the flux change due to the excitation coil and the detected magnetic field. Accordingly, high sensitivity cannot be guaranteed.

SUMMARY OF THE INVENTION

The present invention has been made to overcome the above-mentioned problems of the prior art. Accordingly, it is an object of the present invention to provide a high sensitivity fluxgate sensor integrated in a printed circuit board which is capable of not only reducing overall volume of a system, but also detecting a magnetic field with more accuracy, and a manufacturing method for manufacturing such a high sensitive fluxgate sensor.

Another object of the present invention is to prevent an induction wave in a flux change detecting coil when the external magnetic field is measured as zero (0).

The above objects are accomplished by a fluxgate sensor according to the present invention, including soft magnetic cores having a lower core and an upper core mounted on the lower core, for forming a closed magnetic path on a printed circuit board; an excitation coil formed as a metal film, alternately winding the upper and the lower soft magnetic cores substantially in a number '8' pattern; and a pick-up coil formed as a metal film, having a structure of winding the upper and the lower soft magnetic cores substantially in a solenoid pattern, the pick-up coil being placed on the same plane as an external contour of the excitation coil.

The upper and the lower soft magnetic cores are formed such that their length is in the direction of magnetic field detection.

The above objects are also accomplished by a method for producing a fluxgate sensor according to the present invention, including the steps of: etching a metal plate on a first substrate according to a predetermined pattern for forming an excitation coil, the first substrate being formed of metal plates adhered to one and the other sides of a prepreg; forming a second substrate by adhering a prepreg and a soft magnetic film onto the etched upper portion of the metal plate of the first substrate; forming upper and lower soft magnetic cores by etching the soft magnetic film adhered to one and the other sides of the second substrate; forming a third substrate by adhering a prepreg and a metal plate onto the upper core of the upper and the lower soft magnetic cores; forming via holes through the third substrate, at locations horizontally distanced from one and the other sides of each of the soft magnetic cores; metal-plating the via holes; etching the metal plate adhered onto one and the other sides of the third substrate according to the predetermined pattern for an excitation coil and a pick-up coil; and forming a pad for electrical conductivity, on the upper portion of the third substrate where the excitation coil and the pick-up coil are formed.

According to the present invention, by forming a soft magnetic core along a direction of detection, counter-magnetic properties can be reduced, while there is no induction wave in a flux change detecting coil due to the structure in which a pick-up coil is mounted on an excitation coil that is wound around the soft magnetic core.

BRIEF DESCRIPTION OF THE DRAWINGS

The above-mentioned objects and feature of the present invention will be more apparent by describing the preferred embodiments of the present invention by referring to the appended drawings, in which.

DETAILED DESCRIPTION OF THE PREFERRED EMBODIMENTS

From now on, the present invention will be described in greater detail by referring to the appended drawings.

Figure 1:
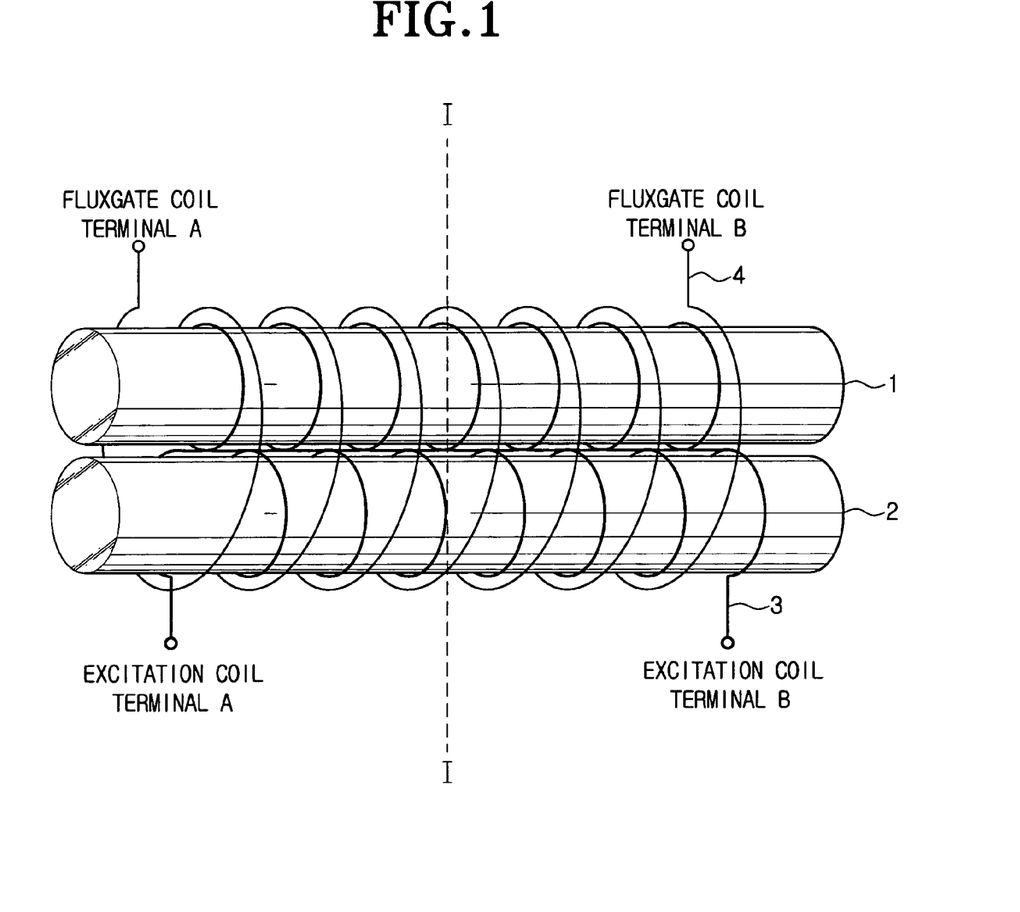
FIG. 1 is a typical diagram showing a fluxgate sensor according to a first preferred embodiment of the present invention.

FIG. 1 is a view showing a fluxgate sensor integrated into a printed circuit board according to the first preferred embodiment of the present invention. The fluxgate sensor has first and second bar-type soft magnetic cores 1 and 2 with an excitation coil 3 being wound thereon substantially in the pattern of number '8', and a pick-up coil 4 wound around the excitation coil 3, the first bar-type soft magnetic core 1 and the second bar-type soft magnetic core 2 substantially in a solenoid pattern. Hereinafter, the winding structure, in which coil is wound around the first and second bar-type soft magnetic cores altogether in the number '8' pattern, will be called a 'united structure'.

Figure 2:
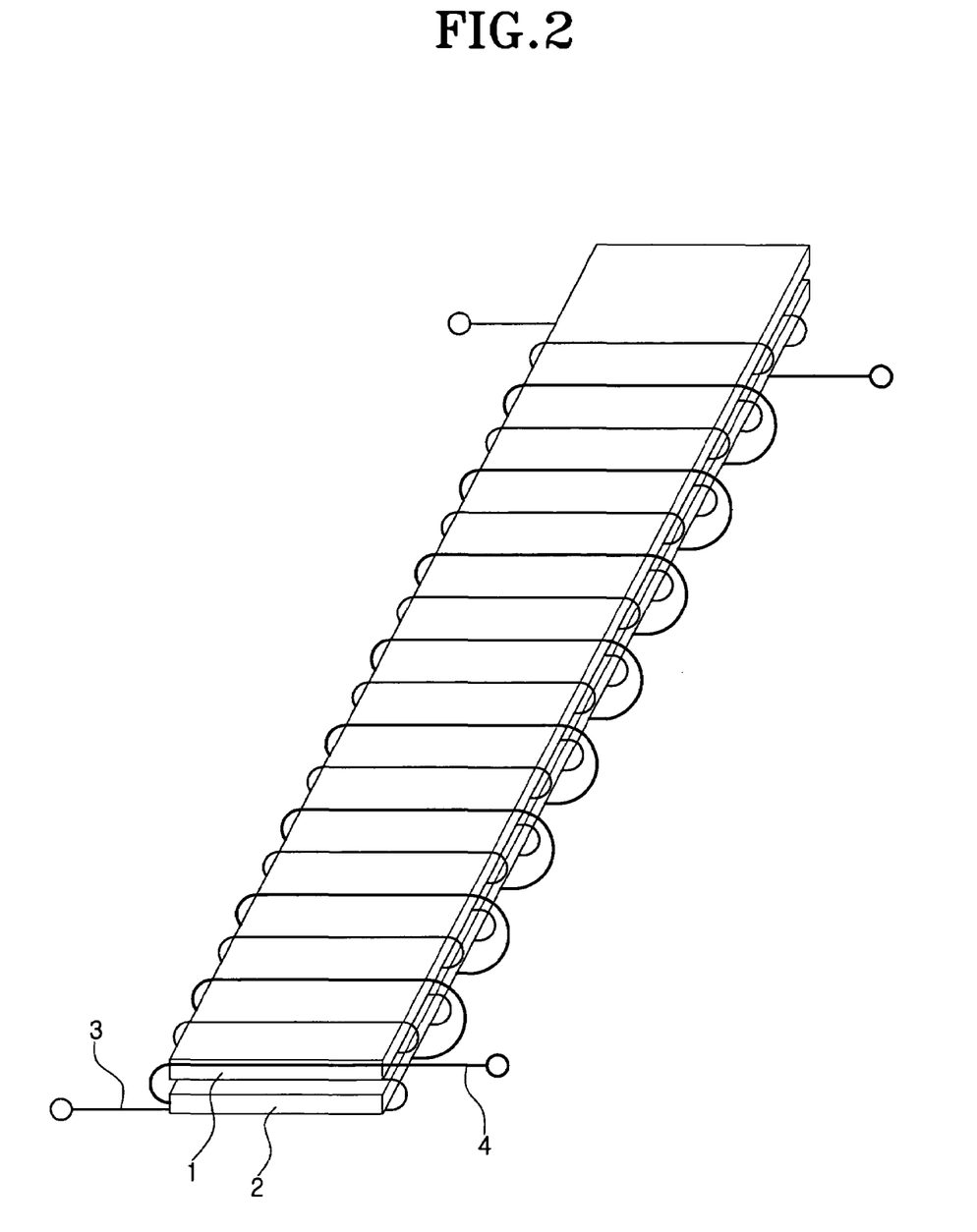
FIG. 2 is a view schematically showing the winding structure according to the shape of soft magnetic core formed on the printed circuit board.

FIG. 2 is a view schematically showing the winding structure according to the shape of first and second bar-type soft magnetic cores 1 and 2 of FIG. 1 being formed on the printed circuit board.

Figure 3:
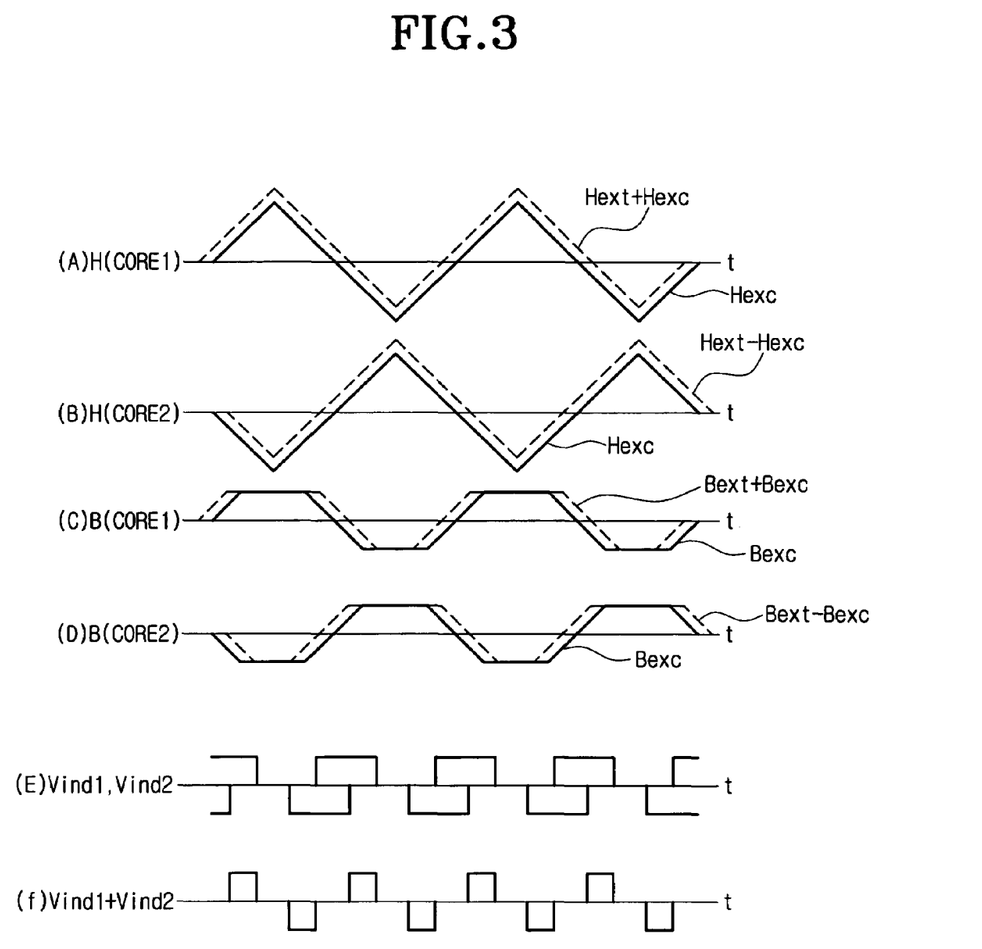
FIGS. 3A through 3F are waveforms for explaining the operation of the fluxgate sensor of FIG. 1.

FIGS. 3A through 3F are timing views for explaining the operation of the fluxgate sensor of FIG. 2. FIG. 3A is a waveform of a magnetic field generated from a first soft magnetic core 1, FIG. 3B is a waveform of a magnetic field generated from a second soft magnetic core, FIG. 3C is a waveform of a flux density generated from the first soft magnetic core 1, FIG. 3D is a waveform of a flux density generated from the second soft magnetic core 2, and FIGS. 3E and 3F are waveforms for respectively showing first and second induction voltages Vind1 and Vind2 induced at the pick-up coil, and the sum of the first and second induction voltages Vind1+Vind2.

With the excitation coil 3 winding the first and second bar-type soft magnetic cores 1 and 2 altogether in the pattern of number '8' (FIGS. 1 and 2) and with the supply of AC excitation current, the internal magnetic field (Hext+Hexc) and flux density (Bext+Bexc) at the first bar-type soft magnetic core 1 and the internal magnetic field (Hext−Hexc) and flux density (Bext−Bexc) at the second bar-type soft magnetic core 2 are in opposite directions (FIGS. 3A, 3B, 3C, 3D). Here, Hext is the external magnetic field, Hexc is the magnetic field by excitation coil, Bext is the flux density by the external magnetic field and Bexc is the flux density by the excitation coil.

The pick-up coil 4 is wound to gain a sum of the flux generated from the first and second bar-type soft magnetic cores 1 and 2, and to detect the changes in the flux by the electronic induction by the AC excitation current. Since the internal magnetic fields of the first and second bar-type soft magnetic cores 1 and 2 are in opposite directions, the induction voltage detected at the pick-up coil 4 is the result of offsetting the two symmetrically generated induction voltages Vind1 and Vind2 (FIG. 3F). In other words, since the external magnetic field Hext is applied to the first and second bar-type soft magnetic cores 1 and 2 in the same direction, the internal magnetic fields of the first and second bar-type soft magnetic cores 1 and 2 are Hext+Hexc and Hext−Hexc. At this time, as shown in FIG. 3E, voltages Vind1 and Vind2 are induced at the pick-up coil 4 by the internal magnetic fields of the respective cores 1 and 2, and the magnitude of the external magnetic field Hext is obtained by detecting the sum of such induction voltages Vind1 and Vind2.

As could be noted from the above regarding the construction of the fluxgate sensor integrated into the printed circuit board, it is important to bond: the first and second bar-type soft magnetic cores 1 and 2 mounted in the vertical direction; the excitation coil 3 having the united structure in a number '8' pattern; and the pick-up coil 4 winding the first and second bar-type soft magnetic cores 1 and 2 in a solenoid pattern so as to obtain the sum of the flux changes in the first and second bar-type soft magnetic cores 1 and 2, on the same plane as the outer contour of the excitation coil 3. This is because the structure of the fluxgate sensor described above offsets the induction waves of the magnetic field generated from the first and second bar-type soft magnetic cores 1 and 2 in the absence of the external magnetic field Hext, with the flux generated by the excitation coil forming a closed-magnetic path at the bar-type soft magnetic cores 1 and 2.

The detection of a magnetic field is also possible using the structure of a single soft magnetic core being arranged with the excitation coil and the pick-up coil. This case, however, requires more complicated signal processing of the output from the detecting coil, such as amplification and filtering, because there are induction voltage waves generated at the detection coil by the larger excitation coil even in the absence of the external magnetic field. Accordingly, using the two bar-type cores, or a single rectangular-ring type core, will allow more advantages, especially in terms of signal processing requirements.

Figure 4A:
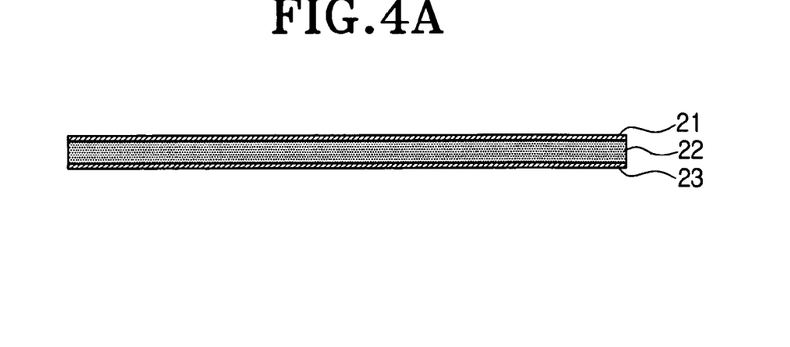
FIGS. 4A through 4I are sectional views taken on line I—I of the fluxgate sensor of FIG. 1, for showing the producing process.

FIGS. 4A through 4I are sectional views taken on line I—I of FIG. 1, for showing the process of producing the fluxgate sensor integrated in the printed circuit board. The fluxgate sensor uses a first substrate, which is formed of two copper plates 21 and 23 each being adhered to one and the other sides of a prepreg 22 (FIG. 4A).

Figure 4B:
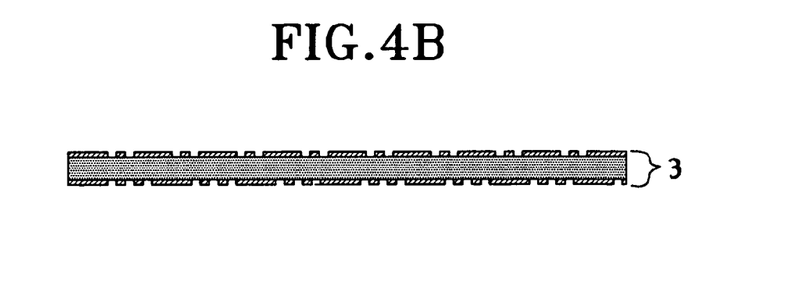

Next, by using the photosensitive paint and the exposure with respect to the copper plates 21 and 23, a pattern for one end of the excitation coil 3 of the united structure is formed. Then, by etching, one end of the excitation coil 3 is formed on opposite side surfaces (first plane 21 and second plane 23) of the prepeg 22 (FIG. 4B).

Figure 4C:
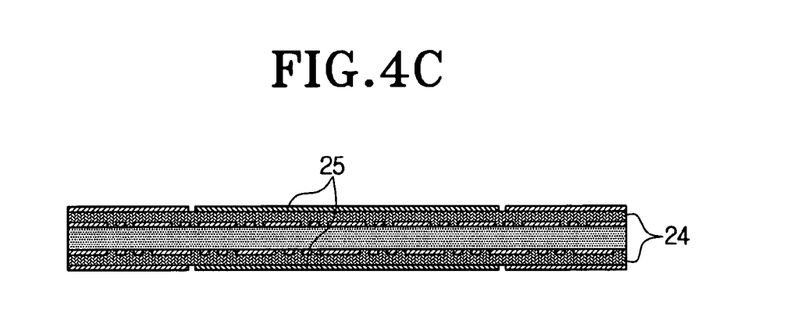

The second substrate is formed by the bonding of a prepreg 24 and soft magnetic layer 25 onto the etched upper portion of the first substrate (FIG. 4C). By using photosensitive paint and an exposure with respect to the metal plate on both sides of the second substrate, the pattern for the first and second soft magnetic cores 1 and 2 is formed.

Figure 4D:
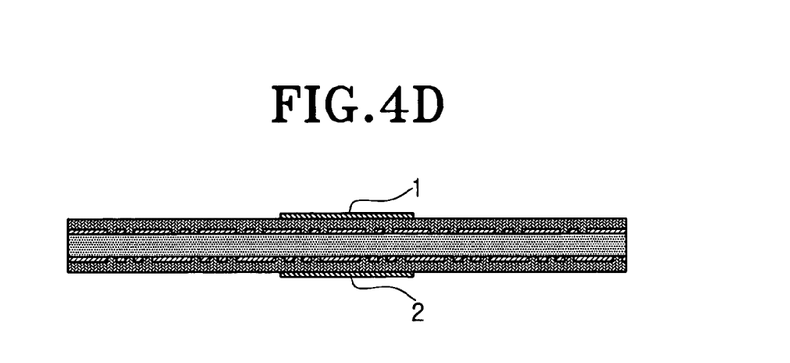

Then, by etching, the first and second soft magnetic cores 1 and 2 are formed (FIG. 4D).

Figure 4E:
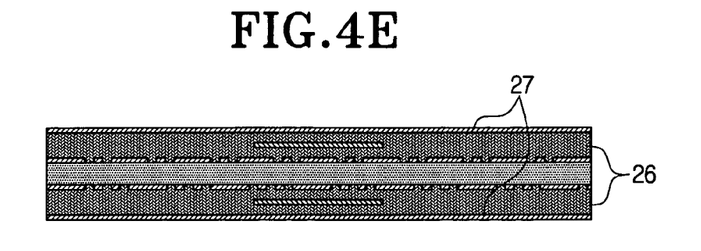

Next, by adhering a prepreg 26 and a copper plate 27 onto the upper portion of the second substrate, a third substrate is formed (FIG. 4E).

Figure 4F:
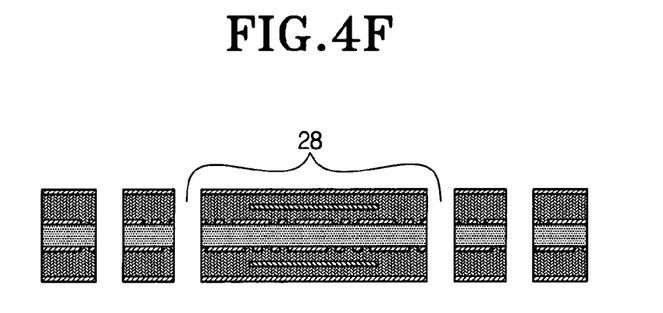

Then, via holes 28 are formed through the third substrate, at locations horizontally distanced from the first and second bar-type soft magnetic cores 1 and 2 (FIG. 4F).

Figure 4G:
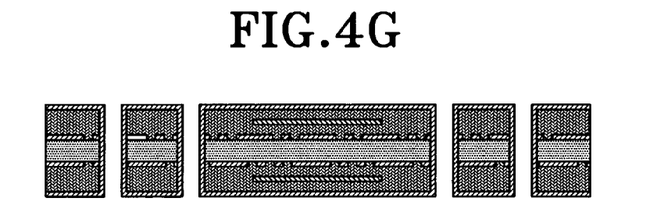

For the purpose of forming the excitation coil and the pick-up coil, the respective via holes are metal-plated (FIG. 4G).

Figure 4H:
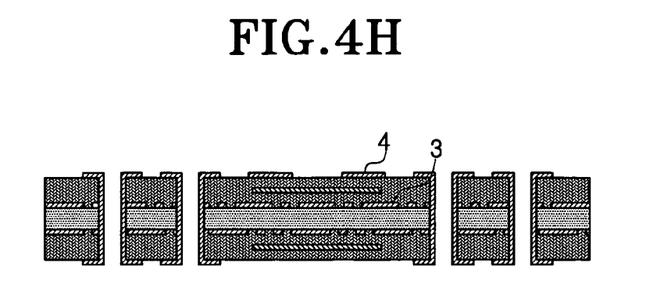
Figure 4I:
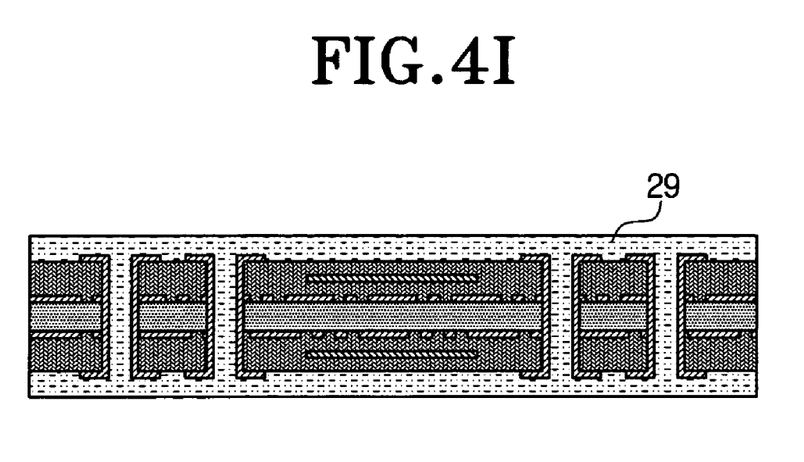

The next processes are: forming a pattern for the excitation coil 3 and the pick-up coil 4 by using photosensitive paint and an exposure on the copper plates adhered to one and the other sides of the third substrate; and then forming the excitation coil 3 and the pick-up coil 4 through etching (FIG. 4H). The excitation coil 3 is patterned to have a structure of alternately winding, together with the excitation coil of FIG. 4B, the upper (first) and lower (second) bar-type soft magnetic cores 1 and 2 altogether and substantially in a number '8' pattern. Also, the pick-up coil 4 is formed to have a structure of winding the upper (first) and lower (second) bar-type soft magnetic cores 1 and 2 altogether and substantially in a solenoid pattern.

After a solder resist (FIG. 4I), a pad is formed by using a solder mask on the upper portion of the third substrate for electrical conductivity, and the upper portion of the pad is metal-plated with gold (not shown).

Figure 5A:
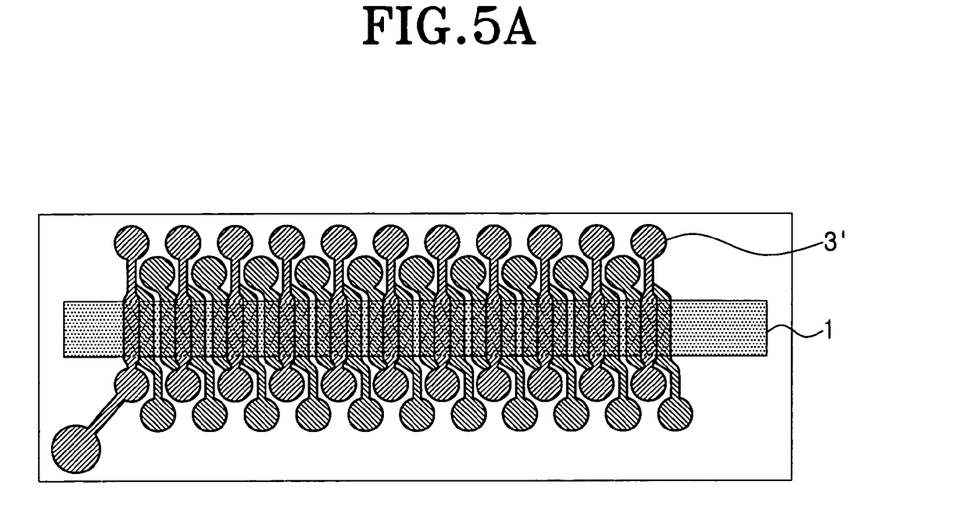
FIG. 5A is a plan view showing the shape of one end of the excitation coil winding the upper one of the two bar-type soft magnetic cores that are arranged in a vertically mounted manner.
Figure 5B:
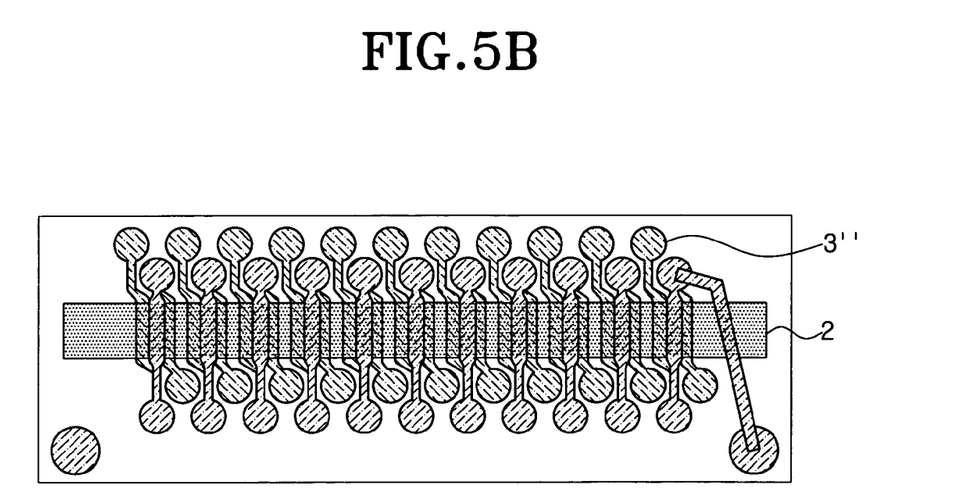
FIG. 5B is a plan view showing the shape of one end of the excitation coil winding a lower one of the two bar-type soft magnetic cores that are arranged in a vertically mounted manner.

FIGS. 5A through 5D are plan views showing the fluxgate sensor formed on the printed circuit board according to the preferred embodiment of the present invention. FIG. 5A is a plan view showing the shape of one end 3' of the excitation coil, winding the upper (first) magnetic core 1 of the two bar-type soft magnetic cores 1 and 2, FIG. 5B is a plan view showing the shape of one end 3" of the excitation coil, winding the lower (second) magnetic core 2 of the two bar-type soft magnetic cores 1 and 2. The excitation coils 3' and 3" of FIGS. 5A and 5B are connected with each other, and wind the upper (first) and lower (second) soft magnetic cores 1 and 2 in alternate fashion.

Figure 5C:
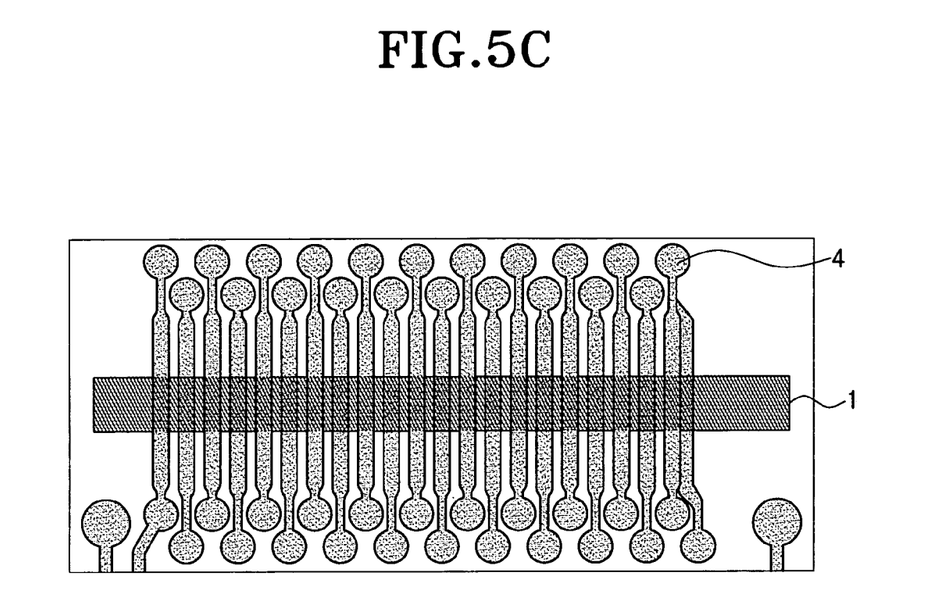
FIG. 5C is a plan view showing the shape of the pick-up coil winding the two bar-type soft magnetic cores arranged in vertically mounted manner altogether and substantially in a solenoid pattern.
Figure 5D:
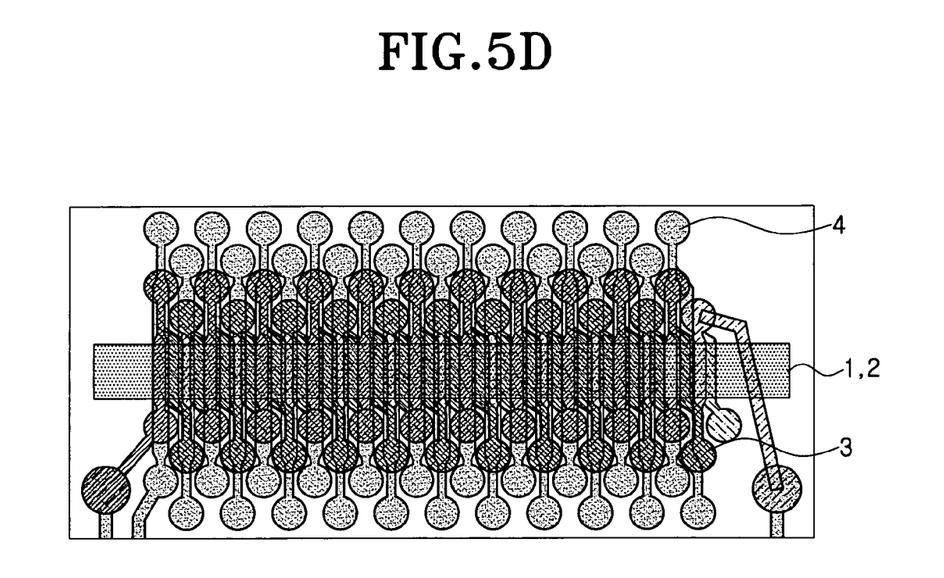
FIG. 5D is a plan view showing the excitation coil and the pick-up coil winding the two bar-type soft magnetic cores arranged in vertically mounted manner altogether.

FIG. 5C is a plan view showing the shape of the pick-up coil 4 winding the upper (first) and lower (second) bar-type soft magnetic cores 1 and 2 altogether, and FIG. 5D is a plan view showing the shape of the excitation coil and the pick-up coil winding the upper (first) and lower (second) bar-type soft magnetic cores 1 and 2 altogether.

The fluxgate sensor described above can be used in various applications, for example, but not by way of limitation, a navigation system by terrestrial magnetism detection, an earth magnetism change monitor (earthquake prediction), a biological electric measurement instrument, and a device for detecting defects in metals. As for the indirect applications, the fluxgate sensor can also be used in magnetic encoders, contactless potentiometers, electric current sensors, torque sensors, and displacement sensors.

With the fluxgate sensor, which can be integrated in the printed circuit board together with other sensors and circuits, the overall size of a system is reduced greatly. Also, as the voltages induced from the respective cores of sides are driven variably, sensitivity is kept high to detect even a weak external magnetic field.

Also, as the fluxgate sensor according to the present invention can be produced at a cheaper price than the bar-type cores or annular cores, mass-production is enabled.

Although the preferred embodiments of the present invention have been described, it will be understood by those skilled in the art that the present invention should not be limited to the described preferred embodiments, but various changes and modifications can be made within the spirit and scope of the present invention as defined by the appended claims.

What is claimed is:

1. A fluxgate sensor formed as a printed circuit board, comprising:

upper and lower soft magnetic cores arranged to form a closed magnetic path on the printed circuit board, the upper soft magnetic core being mounted on the lower soft magnetic core;

an excitation coil formed as a metal film, alternately winding the upper and lower soft magnetic cores substantially in a number '8' pattern; and a pick-up coil formed as a metal film, having a structure of jointly winding the upper and the lower soft magnetic cores substantially in a spiral pattern, the pick-up coil being disposed on a same plane of the printed circuit board as an outer contour of the excitation coil, and an inner contour of the excitation coil being disposed on first and second planes of the printed circuit board located between the upper and lower soft magnetic cores.

2. The fluxgate sensor of claim 1, wherein a lengthwise axis of the upper and lower soft magnetic cores extends in a direction of magnetic field detection.

\* \* \* \* \*